United States Patent
Lee et al.

(10) Patent No.: US 10,694,297 B1
(45) Date of Patent: Jun. 23, 2020

(54) BACK CHAMBER VOLUME ENLARGEMENT MICROPHONE PACKAGE

(71) Applicant: Fortemedia, Inc., Santa Clara, CA (US)

(72) Inventors: Hsin-Li Lee, Tainan (TW); Jien-Ming Chen, Tainan (TW); Wen-Shan Lin, Tainan (TW); Nai-Hao Kuo, Tainan (TW); Feng-Chia Hsu, Kaohsiung (TW)

(73) Assignee: FORTEMEDIA, INC., Santa Clara, CA (US)

( * ) Notice: Subject to any disclaimer, the term of this patent is extended or adjusted under 35 U.S.C. 154(b) by 0 days.

(21) Appl. No.: 16/363,013

(22) Filed: Mar. 25, 2019

(51) Int. Cl.
  *H04R 19/04* (2006.01)
  *B81B 7/00* (2006.01)

(52) U.S. Cl.
  CPC .......... *H04R 19/04* (2013.01); *B81B 7/0061* (2013.01); *B81B 2201/0257* (2013.01); *B81B 2203/0315* (2013.01); *B81B 2203/0353* (2013.01); *B81B 2207/012* (2013.01); *B81B 2207/098* (2013.01); *H04R 2201/003* (2013.01)

(58) Field of Classification Search
  CPC ...... H04R 19/04; H04R 19/005; H04R 21/02; H04R 1/02; B81B 7/007; B81B 2201/0257; B81B 2201/0264; B81B 2201/0285; B81B 2201/003; B81B 2201/02; B81B 2203/0315; B81B 2203/0323; B81B 2203/033; B81B 2203/0338; B81B 2203/0353; B81B 2207/015; B81B 2207/098; B81B 2207/092; B81B 2207/097
  See application file for complete search history.

(56) References Cited

U.S. PATENT DOCUMENTS

| 8,526,665 | B2 * | 9/2013 | Lutz | H04R 19/04 381/369 |
| 2008/0247585 | A1 * | 10/2008 | Leidl | B81B 7/0061 381/360 |
| 2009/0001553 | A1 * | 1/2009 | Pahl | B81B 7/0064 257/704 |
| 2010/0046780 | A1 * | 2/2010 | Song | H04R 19/016 381/361 |
| 2019/0014421 | A1 * | 1/2019 | Lim | B81B 7/0019 |

* cited by examiner

*Primary Examiner* — Fan S Tsang
*Assistant Examiner* — Angelica M McKinney
(74) *Attorney, Agent, or Firm* — McClure, Qualey & Rodack, LLP

(57) ABSTRACT

A MEMS microphone package includes a substrate, a transducer, an integrated circuit chip, and a housing. The substrate has a hollow chamber, a first opening and a second opening, wherein the first opening and the second opening communicate with the hollow chamber. The transducer is disposed on the substrate. The integrated circuit chip is disposed on the substrate. The housing is disposed on the substrate, and covers the integrated circuit chip and the transducer.

17 Claims, 13 Drawing Sheets

BACK CHAMBER VOLUME ENLARGEMENT MICROPHONE PACKAGE

BACKGROUND OF THE INVENTION

Field of the Invention

The invention relates to MEMS microphone packages, and in particular to a MEMS microphone package including a substrate, which has a hollow chamber and a plurality of openings that communicate with the hollow chamber.

Description of the Related Art

Since electronic products are being developed to be smaller and thinner, how to scale down the size of these electronic products becomes an important issue. Micro electromechanical system (MEMS) technique is a technique for effectively scaling down the size of elements. The concept of the MEMS technique is to combine semiconductor process techniques and precision machinery techniques, and to manufacture micro elements and micro systems with multiple functions. However, the size of the microphone packages would be much smaller than that of conventional microphone packages. Therefore, the volume of back chambers of the microphone packages may be small, and the sensitivity of the microphone packages may be decreased.

BRIEF SUMMARY OF THE INVENTION

Some embodiments of the disclosure provide a MEMS microphone package, including: a substrate, a transducer, a back plate, an integrated circuit chip, and a housing. The substrate has a hollow chamber, a first opening and a second opening, wherein the first opening and the second opening communicate with the hollow chamber. The transducer is disposed on the substrate. The integrated circuit chip is disposed on the substrate. The housing is disposed on the substrate, and covers the integrated circuit chip and the transducer.

In some embodiments, the MEMS microphone package further includes a bonding layer disposed between the integrated circuit chip and the substrate, wherein the bonding layer is disposed around the second opening. In some embodiments, the MEMS microphone package further includes a plurality of wires disposed between the transducer and the integrated circuit chip, and between the integrated circuit chip and the substrate.

In some embodiments, The MEMS microphone package further includes a bonding layer disposed between the transducer and the substrate, wherein the transducer has a first cavity that communicates with the hollow chamber via the first opening, and the bonding layer is disposed around the first opening. The integrated circuit chip has a second cavity that communicates with the hollow chamber via the second opening. In some embodiments, the MEMS microphone package further includes a frame disposed on the substrate, and an opening of the frame overlaps either the first opening or the second opening. The transducer and/or the integrated circuit chip is disposed on the frame. The frame has a third cavity that communicates with the hollow chamber via either the first opening or the second opening. In some embodiments, the MEMS microphone package further includes at least one lid disposed on the substrate, wherein an inner space in the lid communicates with the hollow chamber.

Some embodiments of the disclosure provide a MEMS microphone package, including: a substrate, a transducer, a back plate, an integrated circuit chip, and a housing. The substrate has a hollow chamber. The transducer is disposed on the substrate, and has a first cavity, wherein the first cavity communicates with the hollow chamber. The integrated circuit chip is disposed on the substrate, and has a second cavity, wherein the second cavity communicates with the hollow chamber. The housing is disposed on the substrate, and covers the integrated circuit chip and the transducer.

BRIEF DESCRIPTION OF THE DRAWINGS

The disclosure can be more fully understood by reading the subsequent detailed description and examples with references made to the accompanying drawings, wherein.

DETAILED DESCRIPTION OF THE INVENTION

The MEMS microphone packages of some embodiments of the present disclosure are described in the following description. However, it should be appreciated that the following detailed description of some embodiments of the disclosure provides various concepts of the present disclosure which may be performed in specific backgrounds that can vary widely. The specific embodiments disclosed are provided merely to clearly describe the usage of the present disclosure by some specific methods without limiting the scope of the present disclosure.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure.

Figure 1:
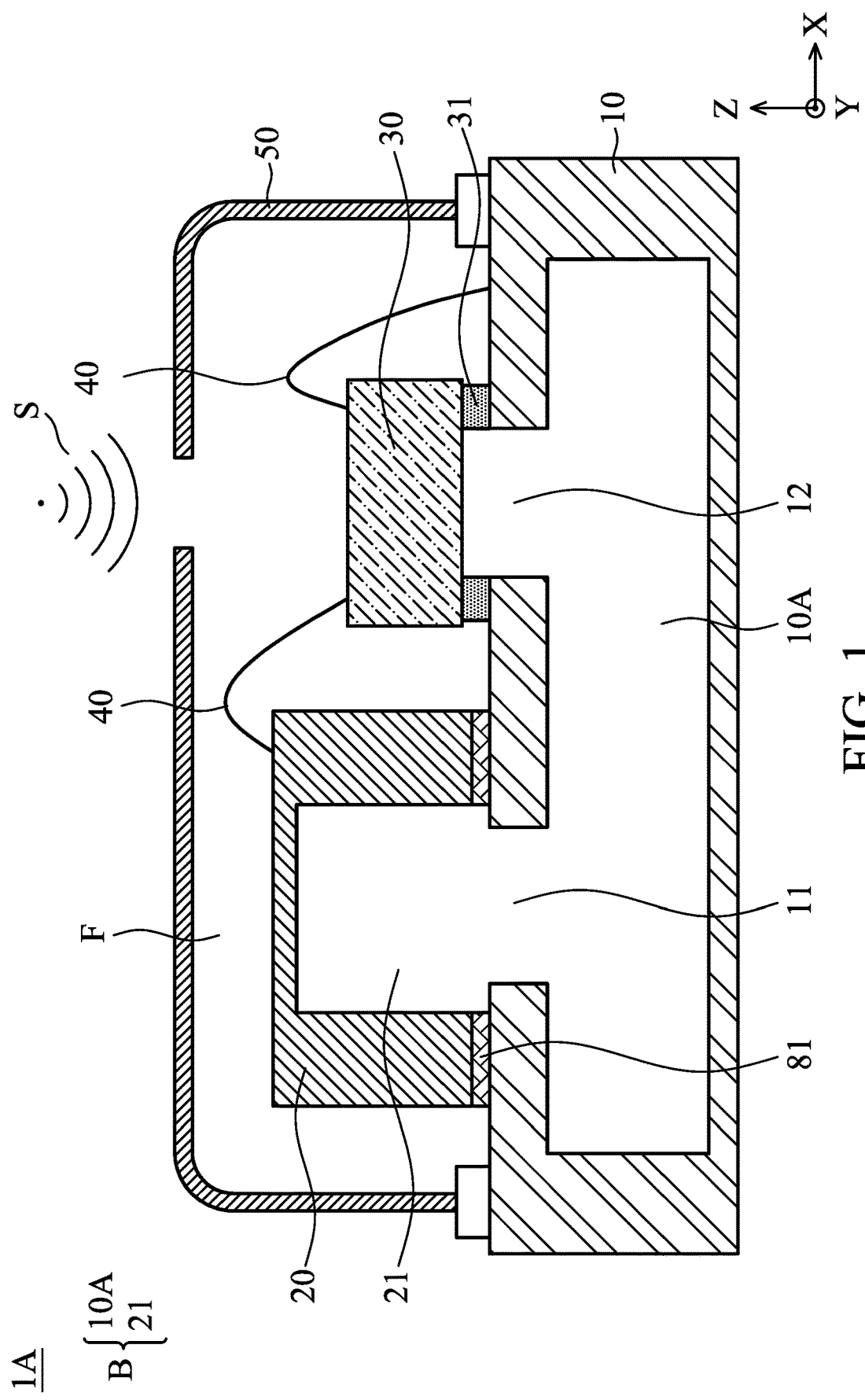
FIG. 1 is a schematic cross-sectional view illustrating a MEMS microphone package in accordance with some embodiments of the present disclosure.

Referring to FIG. 1, FIG. 1 is a schematic cross-sectional view illustrating a MEMS microphone package 1A in accordance with some embodiments of the present disclosure. As shown in FIG. 1, the MEMS microphone package 1A includes a substrate 10, a transducer 20, an integrated circuit chip 30, and a housing 50. For example, the substrate 10 may be a PCB substrate, or be made of any other suitable material. A hollow chamber 10A is formed in the substrate 10, and a first opening 11 and a second opening 12 are also formed in the substrate. The first opening 11 and the second opening 12 communicate with the hollow chamber 10A. That is, the hollow chamber 10A may communicate with the external environment via the first opening 11.

The transducer 20 is disposed on the substrate 10. In the present embodiment, a bonding layer 81 is formed around the first opening 11 of the substrate 10, and the transducer 20 is bonded to the substrate 10 via the bonding layer 81. For example, the bonding layer 81 may be an adhesive. A first cavity 21 is formed in the transducer 20. For example, the transducer 20 may be at least one membrane with flexibility. The transducer 20 may convert the detected sound S into electrical signals. The integrated circuit chip 30 is disposed on the substrate 10, and is electrically connected to the transducer 20 by a wire 40. Therefore, the electrical signals generated by the transducer 20 may be transmitted to and processed by the integrated circuit chip 30. In addition, the integrated circuit chip 30 may be electrically connected to the substrate 10 by another wire 40. Therefore, the electrical signal may be transmitted to external circuit unit and be further processed.

The housing 50 is disposed on the substrate 10, and covers the integrated circuit chip 30 and the transducer 20 for protecting the aforementioned components disposed in the MEMS microphone package 1A. For example, the housing 50 is made of metallic material, such as copper-containing alloy or stainless steel, but it is not limited thereto. The MEMS microphone package 1A further includes a front chamber F and a back chamber B. In the present embodiment, the front chamber F is referred to the space located between the housing 50, the substrate 10, the transducer 20, and the integrated circuit chip 30, the hollow chamber 10A and the first cavity 21 are combined as the back chamber B.

It should be understood that the volume of the back chamber B is relative to the sensitivity of the MEMS microphone package 1A. The higher the volume of the back chamber B, the better sensitivity of the MEMS microphone package 1A. By arranging a plurality of openings in the substrate 10, the volume of the hollow chamber 10A (also the back chamber B) may be increased. Therefore, the sensitivity of the MEMS microphone package 1A may be enhanced.

In addition, a bonding layer 31 may be disposed between the integrated circuit chip 30 and the substrate 10 for bonding the integrated circuit chip 30 to the substrate. For example, the bonding layer 31 may be an adhesive. It should be noted that the bonding layer 31 is disposed around the second opening 12 of the substrate 10. In other words, as viewed from a vertical direction (Z-axis), the bonding layer 31 and the second opening 12 do overlap. That way, the volume of the hollow chamber 10A may be increased such that the volume of the back chamber B may also be increased. As set forth above, the sensitivity of the MEMS microphone package 1A may be enhanced.

In the following paragraphs, various embodiments of the present disclosure are provided in order to increase the volume of the back chamber B, enhancing the sensitivity of the MEMS microphone packages. It should be appreciated that the following MEMS microphone packages may include the same or similar portions as the MEMS microphone package 1A shown in FIG. 1, those portions that are the same or similar will be labeled with similar numerals. For the sake of simplicity, those portions will not be discussed in detail again.

Figure 2:
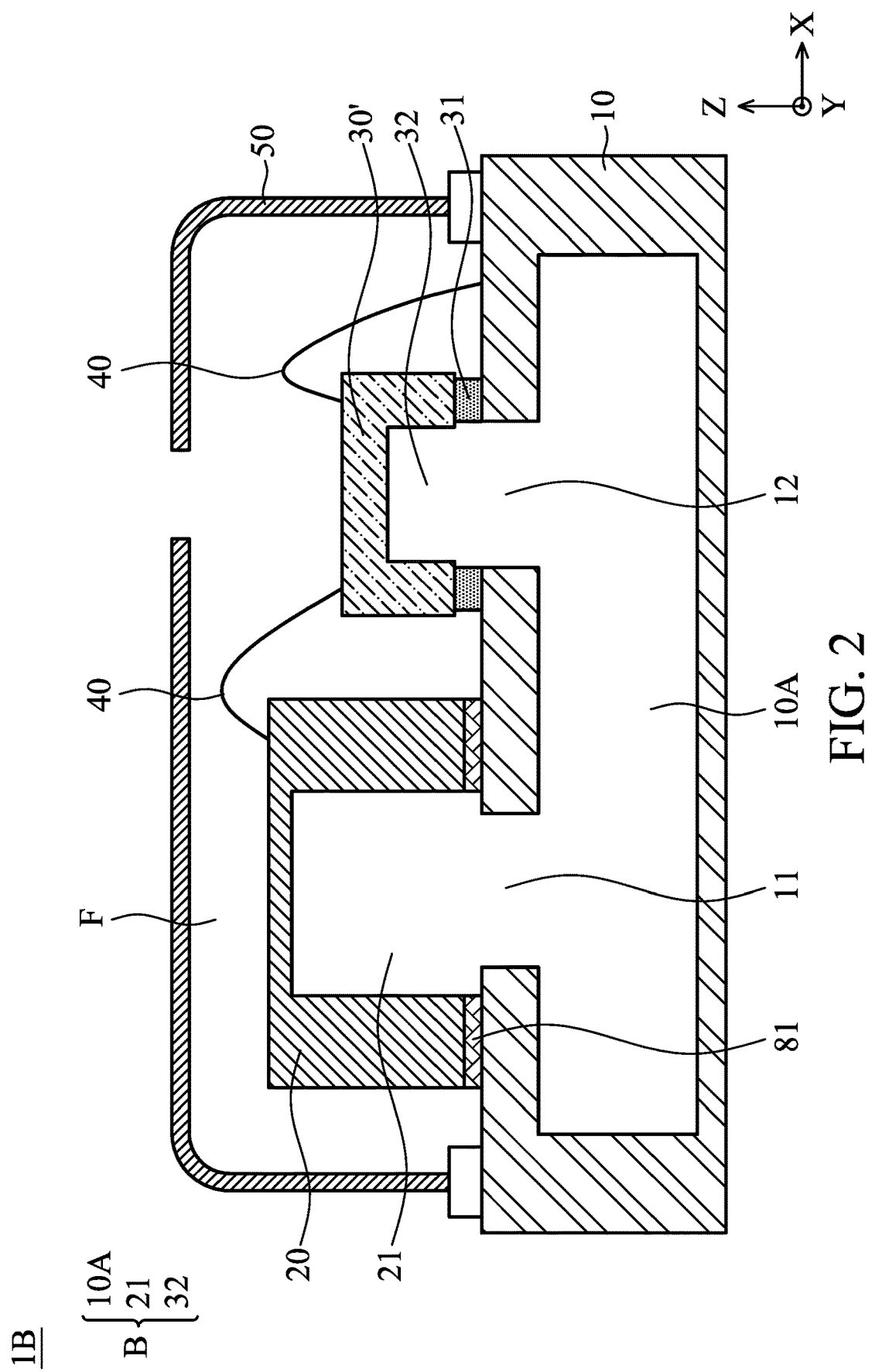
FIG. 2 is a schematic cross-sectional view illustrating the MEMS microphone package in accordance with some other embodiments of the present disclosure.

FIG. 2 is a schematic cross-sectional view illustrating the MEMS microphone package 1B in accordance with some other embodiments of the present disclosure. As shown in FIG. 2, the MEMS microphone package 1B includes a substrate 10, a transducer 20, an integrated circuit chip 30', and a housing 50. The difference between the MEMS microphone package 1B in the present embodiment and the MEMS microphone package 1A shown in FIG. 1 is that a second cavity 32 is formed in the integrated circuit chip 30'. The second cavity 32 may communicate with the hollow chamber 10A via the second opening 12. The back chamber B may include the hollow chamber 10A, the first cavity 21, and the second cavity 32. Therefore, the volume of the back chamber B may be further increased, enhancing the sensitivity of the MEMS microphone package 1B.

Figure 3:
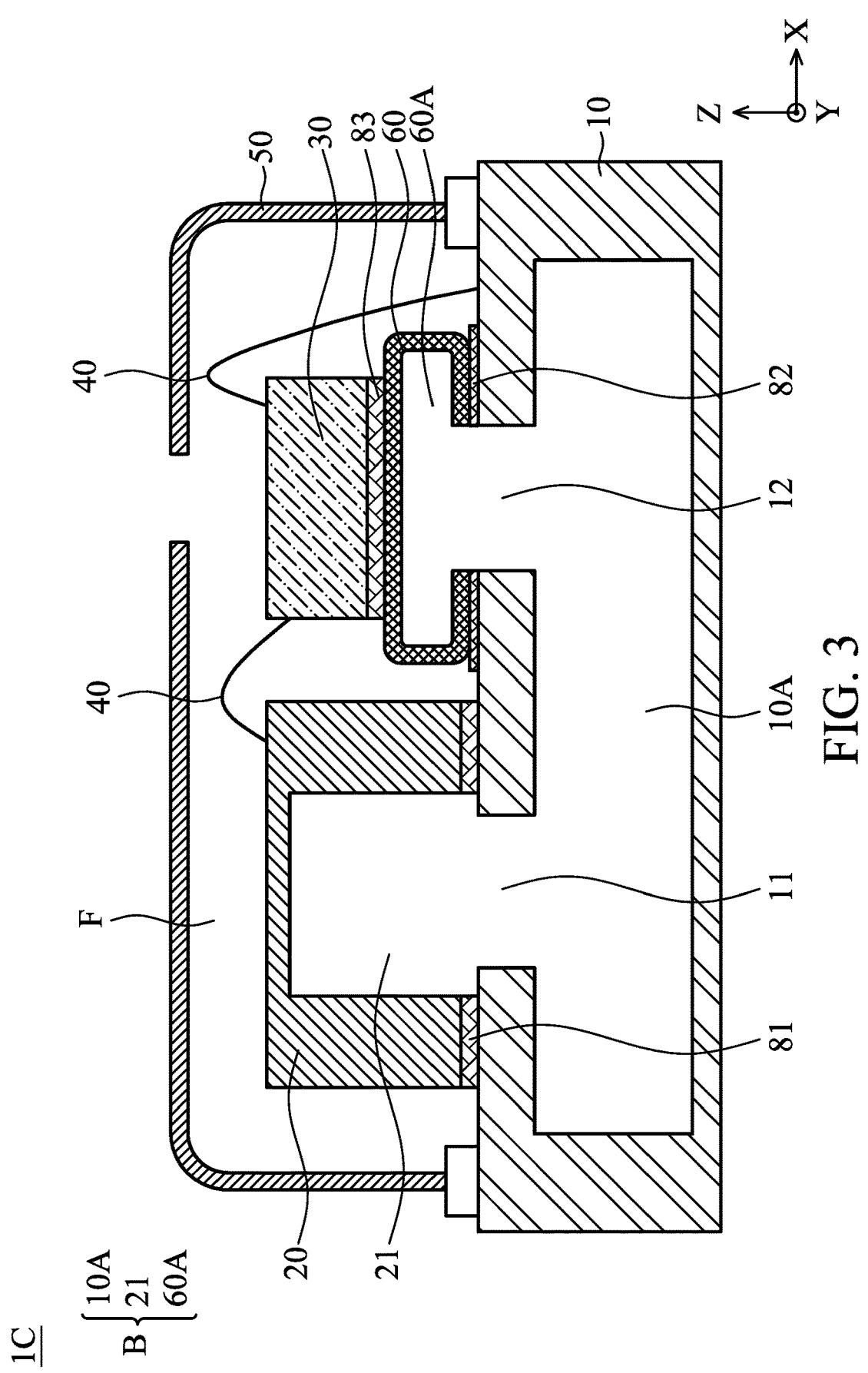
FIG. 3 is a schematic cross-sectional view illustrating the MEMS microphone package in accordance with some other embodiments of the present disclosure.

FIG. 3 is a schematic cross-sectional view illustrating the MEMS microphone package 1C in accordance with some other embodiments of the present disclosure. As shown in FIG. 3, the MEMS microphone package 1C includes a substrate 10, a transducer 20, an integrated circuit chip 30, and a housing 50. The difference between the MEMS microphone package 1C in the present embodiment and the MEMS microphone package 1A shown in FIG. 1 is that the MEMS microphone package 1C further includes a frame 60 disposed on the substrate 10, and the integrated circuit chip 30 is disposed on the frame 60. The frame 60 is bonded to the substrate 10 via a bonding layer 82, and the integrated circuit chip 30 is bonded to the frame 60 via another bonding layer 83. The frame 60 may be formed of metallic or plastic material, but it is not limited thereto. A third cavity 60A is formed in the frame 60, and communicates with the hollow chamber 10A via the second opening 12. Accordingly, the back chamber B may include the hollow chamber 10A, the first cavity 21, and the third cavity 60A. Therefore, the volume of the back chamber B may be greater than the volume of the back chamber B shown in FIG. 1, enhancing the sensitivity of the MEMS microphone package 1C.

Figure 4:
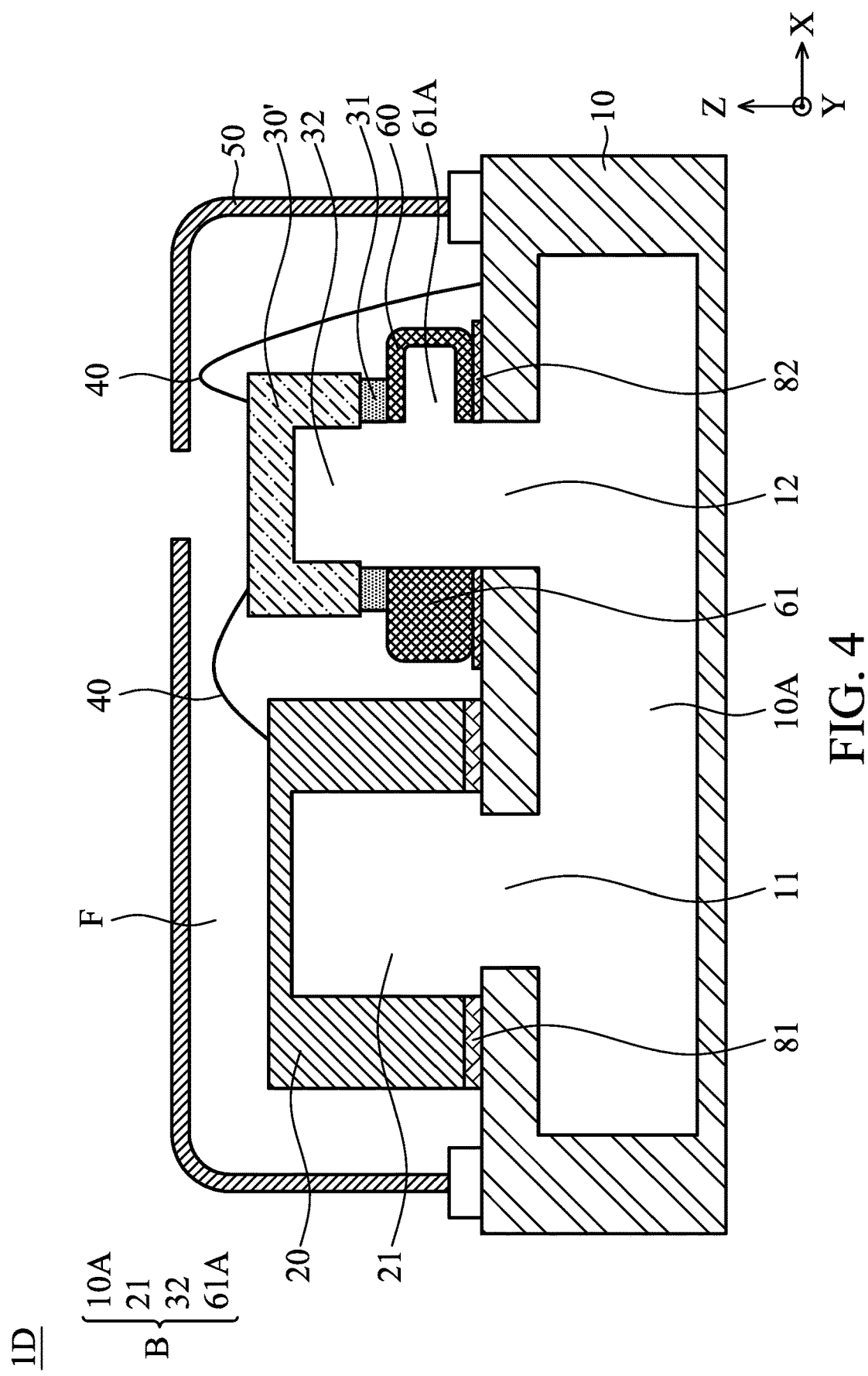
FIG. 4 is a schematic cross-sectional view illustrating the MEMS microphone package in accordance with some other embodiments of the present disclosure.

FIG. 4 is a schematic cross-sectional view illustrating the MEMS microphone package 1D in accordance with some other embodiments of the present disclosure. As shown in FIG. 4, the MEMS microphone package 1D includes a substrate 10, a transducer 20, an integrated circuit chip 30', a housing 50, and a frame 61. The difference between the MEMS microphone package 1D in the present embodiment and the MEMS microphone package 1C shown in FIG. 3 is that the volume of the third cavity 61A of the frame 61 is smaller than the volume of the third cavity 60A of the frame 60. Those skilled in the art may arrange the volume of the third cavity 61A as required, and the present embodiment merely serves as an example.

In addition, the openings of the frame 61 and the second opening 12 of the substrate 10 overlap in the vertical direction (Z-axis). The bonding layer 31 is disposed around the opening of the frame 61. The second cavity 32 of the integrated circuit chip 30' may communicate with the hollow chamber 10A via the third cavity 61A and the second opening 12. Accordingly, the back chamber B may include the hollow chamber 10A, the first cavity 21, the second cavity 32, and the third cavity 61A. Therefore, the volume of the back chamber B may be greater than the volume of the back chamber B shown in FIG. 2, enhancing the sensitivity of the MEMS microphone package 1D.

Figure 5:
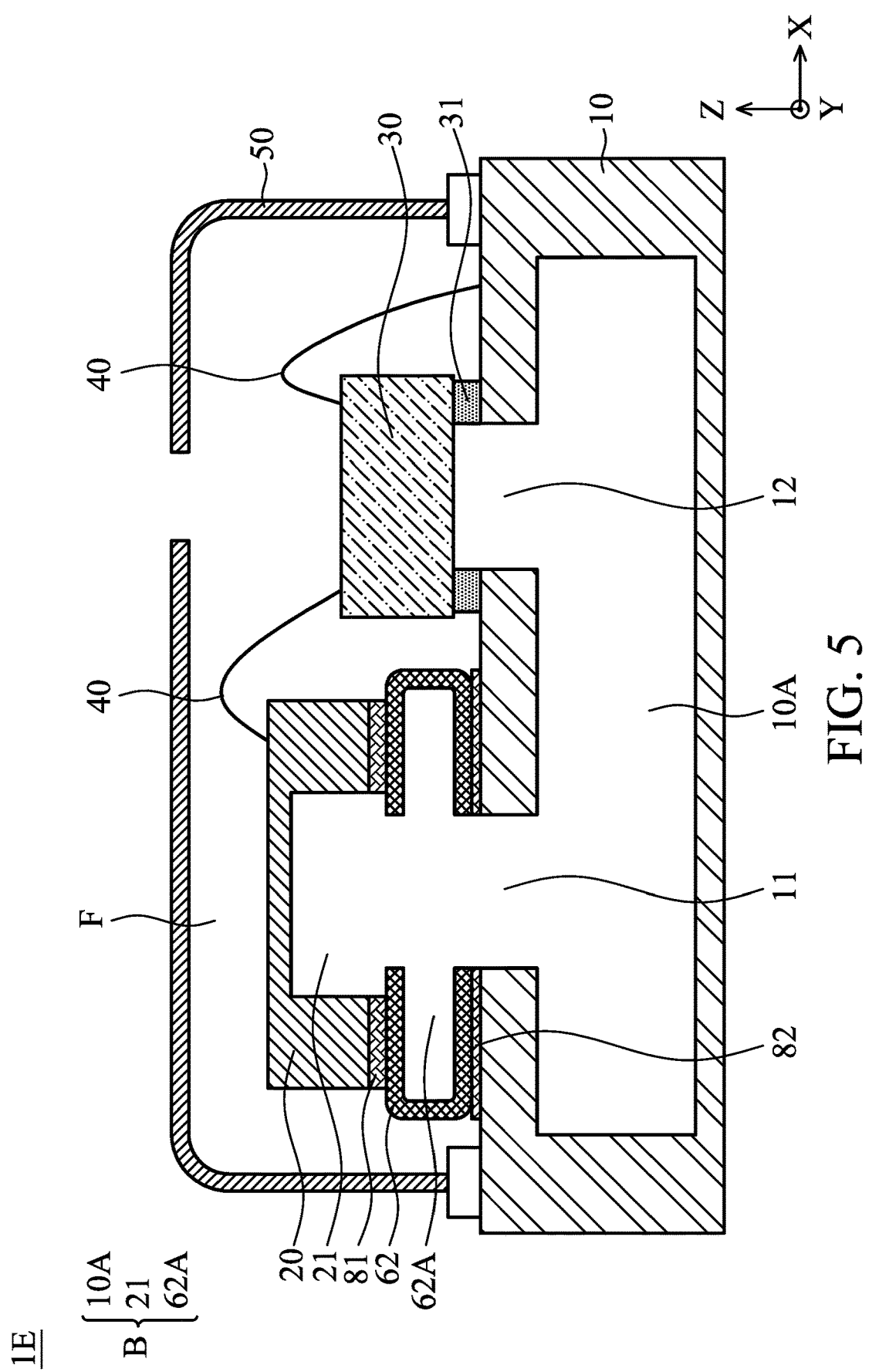
FIG. 5 is a schematic cross-sectional view illustrating the MEMS microphone package in accordance with some other embodiments of the present disclosure.

FIG. 5 is a schematic cross-sectional view illustrating the MEMS microphone package 1E in accordance with some other embodiments of the present disclosure. As shown in FIG. 5, the MEMS microphone package 1E includes a substrate 10, a transducer 20, an integrated circuit chip 30, a housing 50, and a frame 62. The difference between the MEMS microphone package 1E in the present embodiment and the MEMS microphone package 1A shown in FIG. 1 is that the frame 62 is disposed on the substrate 10, wherein the frame 62 is bonded to the substrate 10 via the bonding layer 82, and the openings of the frame 62 and the first opening 11 overlap in the vertical direction (Z-axis). Accordingly, the back chamber B may include the hollow chamber 10A, the first cavity 21, and the third cavity 62A.

Figure 6:
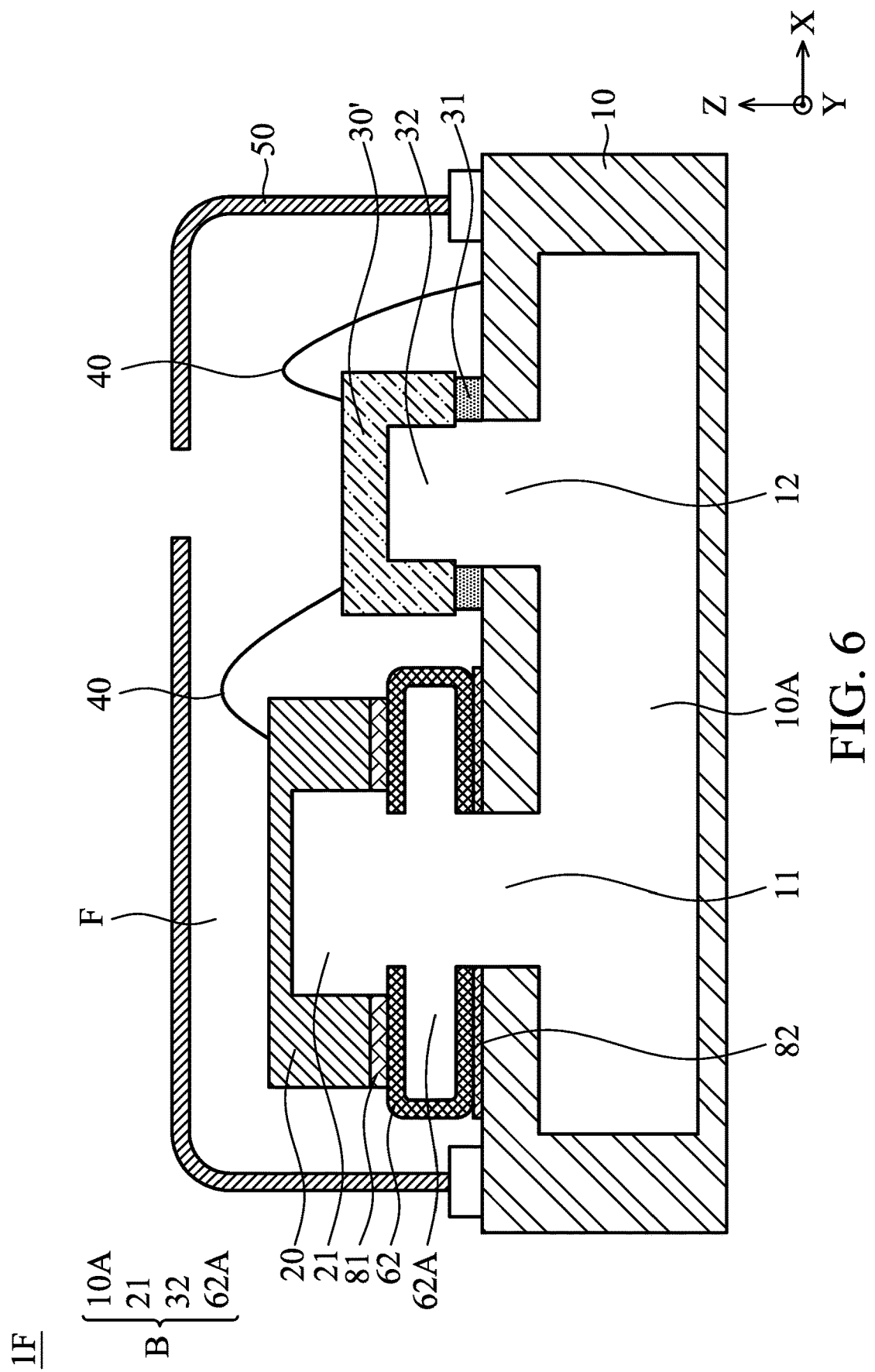
FIG. 6 is a schematic cross-sectional view illustrating the MEMS microphone package in accordance with some other embodiments of the present disclosure.

FIG. 6 is a schematic cross-sectional view illustrating the MEMS microphone package 1F in accordance with some other embodiments of the present disclosure. As shown in FIG. 6, the MEMS microphone package 1F includes a substrate 10, a transducer 20, an integrated circuit chip 30', a housing 50, and a frame 62. The difference between the MEMS microphone package 1F in the present embodiment and the MEMS microphone package 1E shown in FIG. 5 is that the second cavity 32 of the integrated circuit chip 30' communicates with the hollow chamber 10A via the second opening 12. Accordingly, the back chamber B may include the hollow chamber 10A, the first cavity 21, the second cavity 32, and the third cavity 62A.

Figure 7:
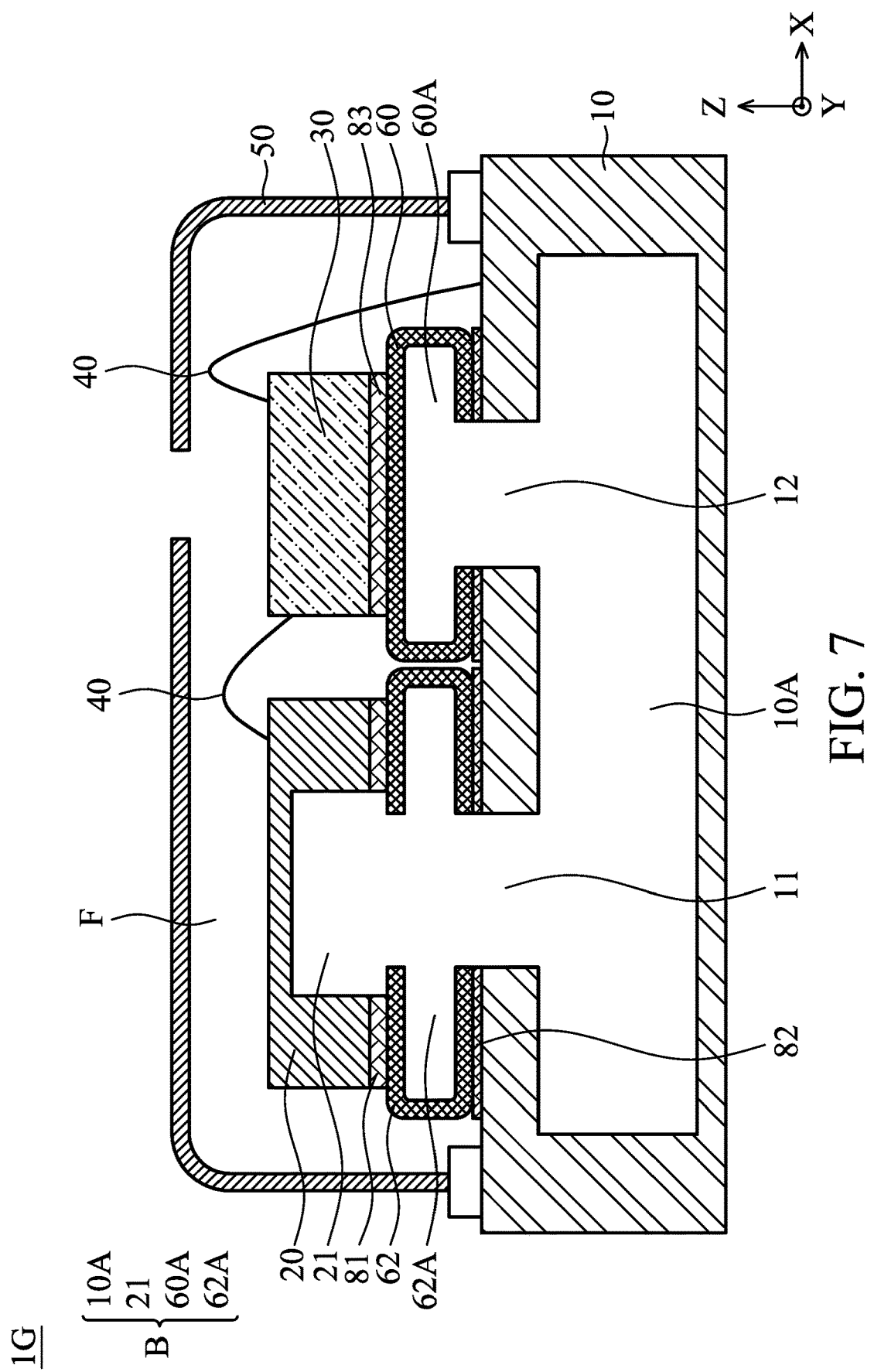
FIG. 7 is a schematic cross-sectional view illustrating the MEMS microphone package in accordance with some other embodiments of the present disclosure.

FIG. 7 is a schematic cross-sectional view illustrating the MEMS microphone package 1G in accordance with some other embodiments of the present disclosure. As shown in FIG. 7, the MEMS microphone package 1G includes a substrate 10, a transducer 20, an integrated circuit chip 30, a housing 50, and a plurality of frames 60, 62. The transducer 20 is disposed on the frame 62, and the integrated circuit chip 30 is disposed on the frame 60. The transducer 20 is bonded to the frame 62 via the bonding layer 81, the frames 60, 62 are bonded to the substrate 10 via the bonding layer 82, and the integrated circuit chip 30 is bonded to the frame 60 via the bonding layer 83. Accordingly, the back chamber B may include the hollow chamber 10A, the first cavity 21, and the third cavities 60A, 62A.

Figure 8:
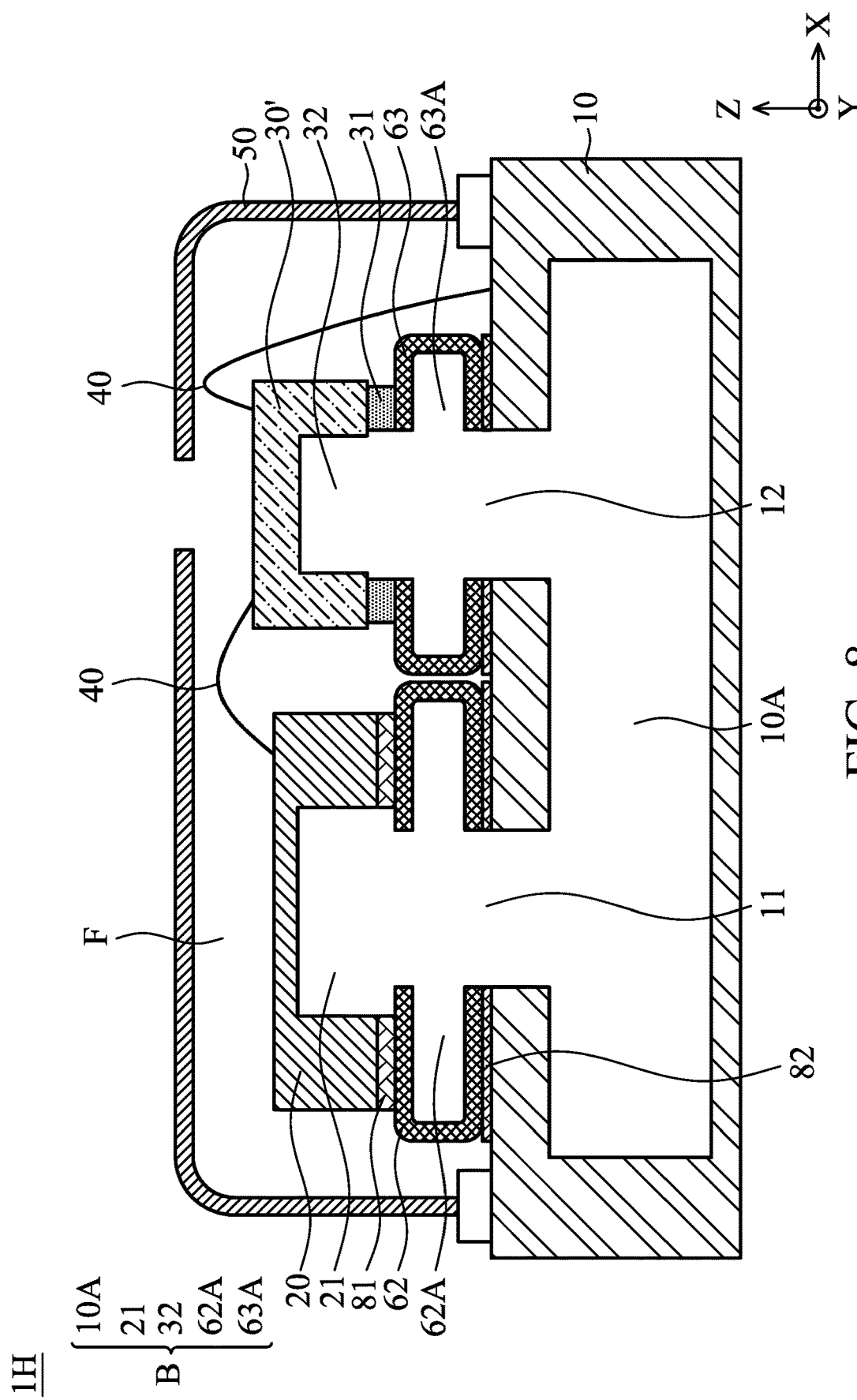
FIG. 8 is a schematic cross-sectional view illustrating the MEMS microphone package in accordance with some other embodiments of the present disclosure.

FIG. 8 is a schematic cross-sectional view illustrating the MEMS microphone package 1H in accordance with some other embodiments of the present disclosure. As shown in FIG. 8, the MEMS microphone package 1H includes a substrate 10, a transducer 20, an integrated circuit chip 30', a housing 50, and a plurality of frames 62, 63. The transducer 20 is disposed on the frame 62, and the integrated circuit chip 30' is disposed on the frame 63. The integrated circuit chip 30' is bonded to the frame 63 via the bonding layer 31. The frames 62, 63 are bonded to the substrate 10 via the bonding layer 82. The first cavity 21 communicates with the hollow chamber 10A via the third cavity 62A, and the second cavity 32 communicates with the hollow chamber 10A via the third cavity 63A. Accordingly, the back chamber B may include the hollow chamber 10A, the first cavity 21, the second cavity 32, and the third cavities 62A, 63A.

Figure 9:
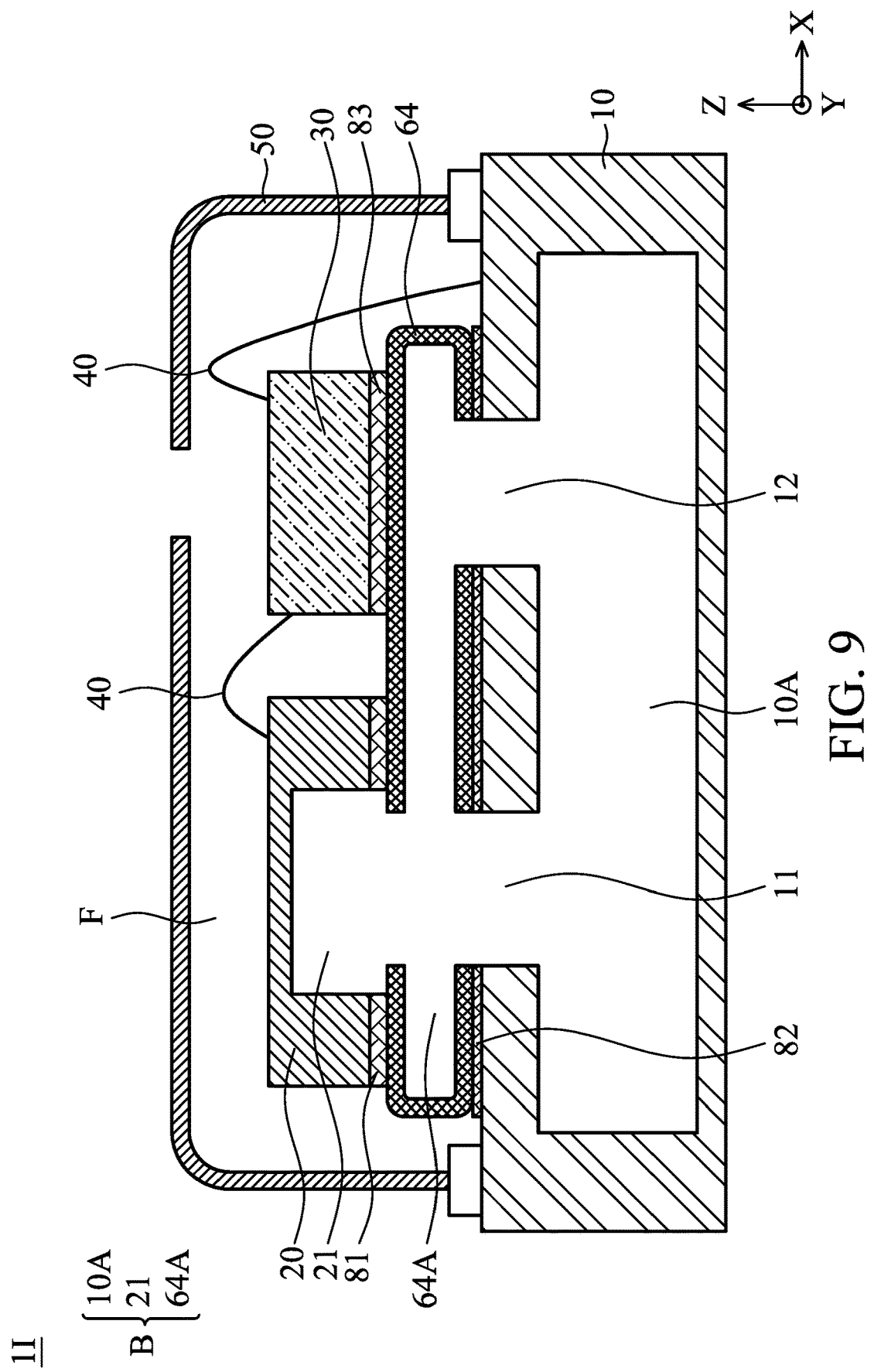
FIG. 9 is a schematic cross-sectional view illustrating the MEMS microphone package in accordance with some other embodiments of the present disclosure.

FIG. 9 is a schematic cross-sectional view illustrating the MEMS microphone package 1I in accordance with some other embodiments of the present disclosure. As shown in FIG. 9, the MEMS microphone package 1I includes a substrate 10, a transducer 20, an integrated circuit chip 30, a housing 50, and a frame 64. The frame 64 is bonded to the substrate 10 via the bonding layer 82. Both of the transducer 20 and the integrated circuit chip 30 are disposed on the frame 64, and each of the openings of the frame 64 is overlapped with the first opening 11 or the second opening 12 in the vertical direction (Z-axis). The first cavity 21 communicates with the hollow chamber 10A via the third cavity 64A. Accordingly, the back chamber B may include the hollow chamber 10A, the first cavity 21, and the third cavity 64A.

Figure 10:
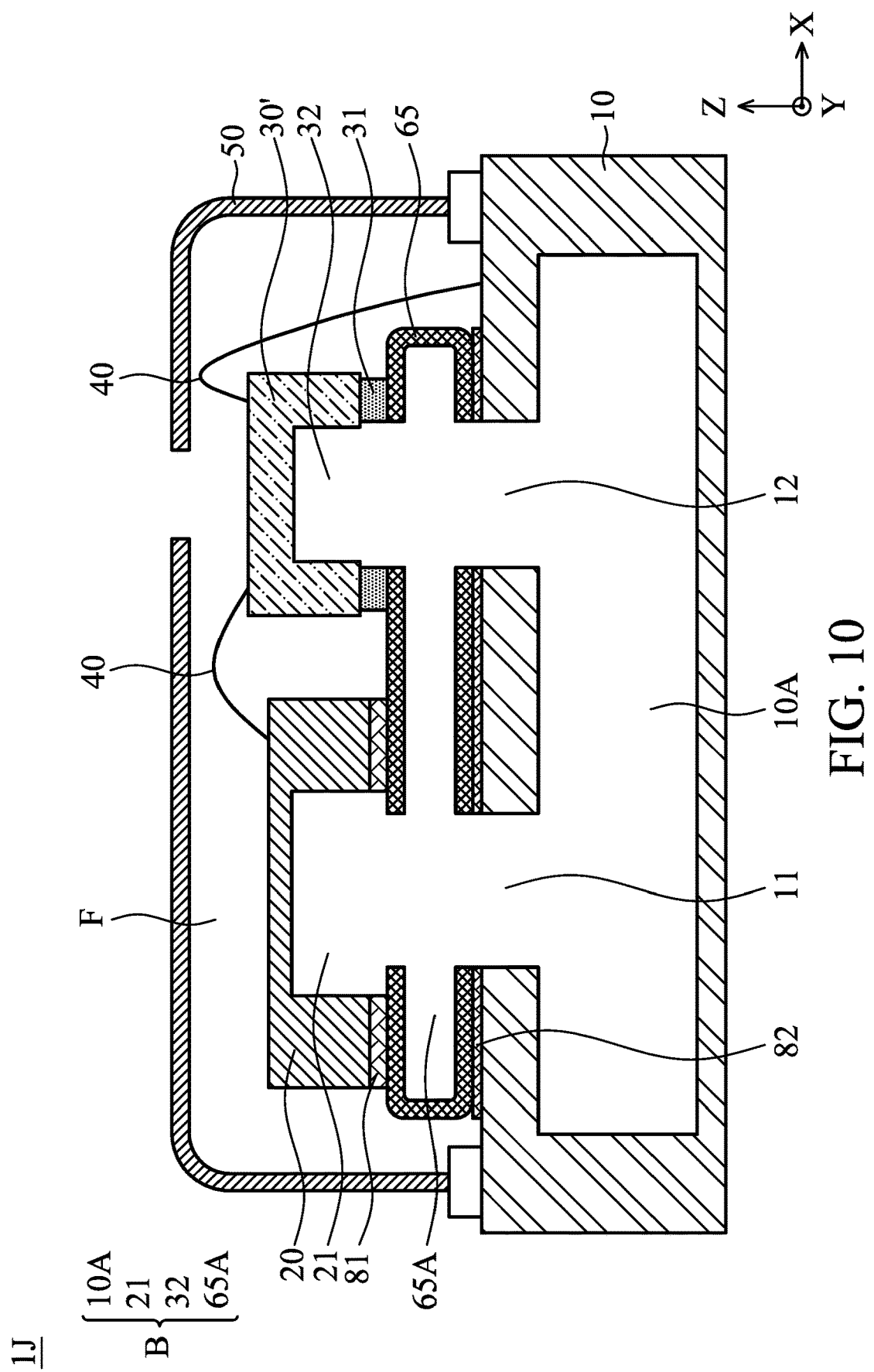
FIG. 10 is a schematic cross-sectional view illustrating the MEMS microphone package in accordance with some other embodiments of the present disclosure.

FIG. 10 is a schematic cross-sectional view illustrating the MEMS microphone package 1J in accordance with some other embodiments of the present disclosure. As shown in FIG. 10, the MEMS microphone package 1J includes a substrate 10, a transducer 20, an integrated circuit chip 30', a housing 50, and a frame 65. The frame 65 is bonded to the substrate 10 via the bonding layer 82. Both of the transducer 20 and the integrated circuit chip 30' are disposed on the frame 65, and each of the openings of the frame 65 is overlapped with the first opening 11 or the second opening 12 in the vertical direction (Z-axis). The first cavity 21 and the second cavity 32 communicate with the hollow chamber 10A via the third cavity 65A. Accordingly, the back chamber B may include the hollow chamber 10A, the first cavity 21, the second cavity 32 and the third cavity 65A.

Figure 11:
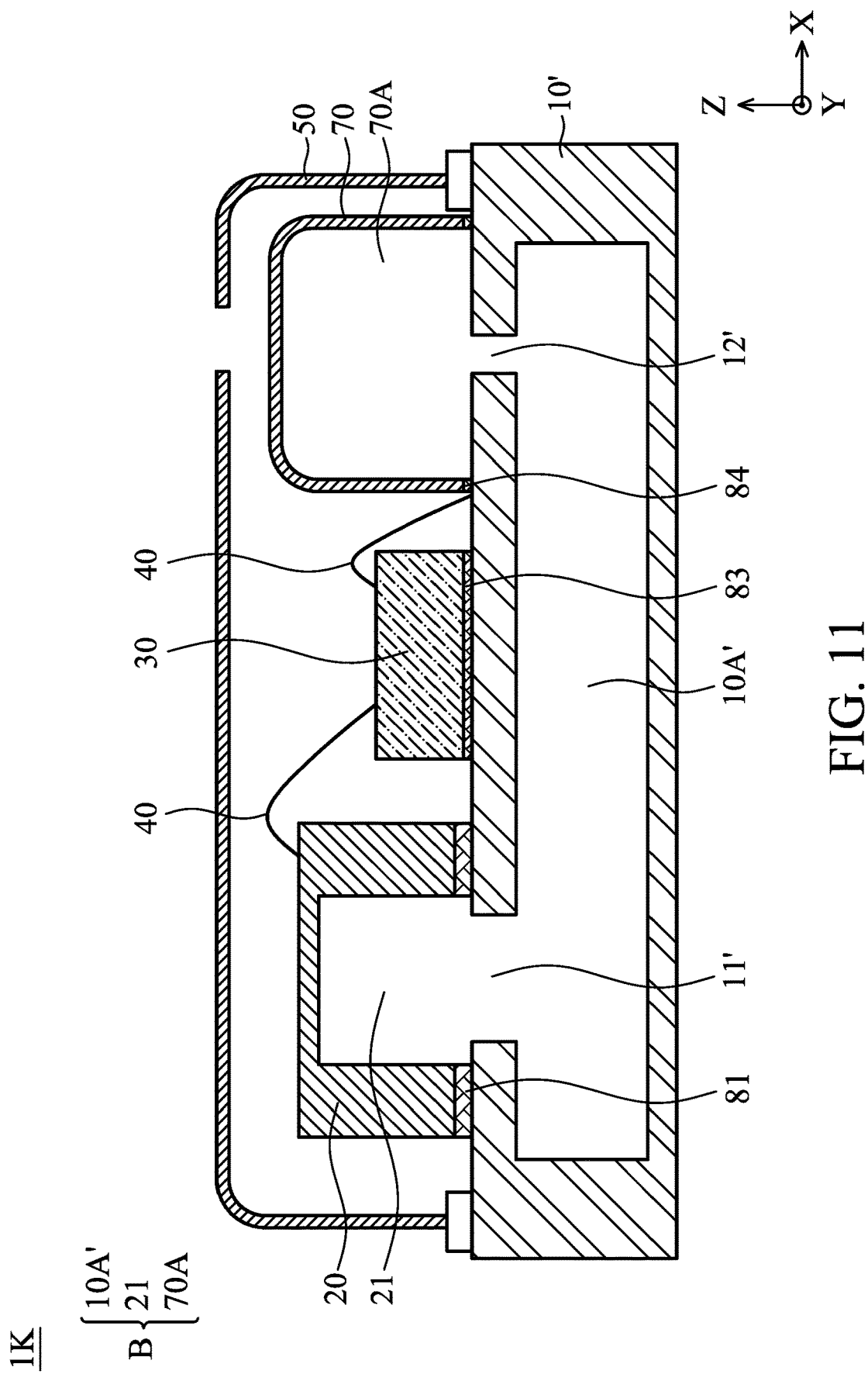
FIG. 11 is a schematic cross-sectional view illustrating the MEMS microphone package in accordance with some other embodiments of the present disclosure.

FIG. 11 is a schematic cross-sectional view illustrating the MEMS microphone package 1K in accordance with some other embodiments of the present disclosure. As shown in FIG. 11, the MEMS microphone package 1K includes a substrate 10', a transducer 20, an integrated circuit chip 30, a housing 50, and a lid 70. The lid 70 is bonded to the substrate 10' via a bonding layer 84, and the integrated circuit chip 30 is bonded to the substrate 10' via a bonding layer 83. The substrate 10' has a first opening 11' and a second opening 12', wherein the first cavity 21 of the transducer 20 communicates with the hollow chamber 10A' via the first opening 11', and an inner space 70A of the lid 70 communicates with the hollow chamber 10A' via the second opening 12'. Accordingly, the back chamber B may include the hollow chamber 10A', the first cavity 21, and the inner space 70A.

Figure 12:
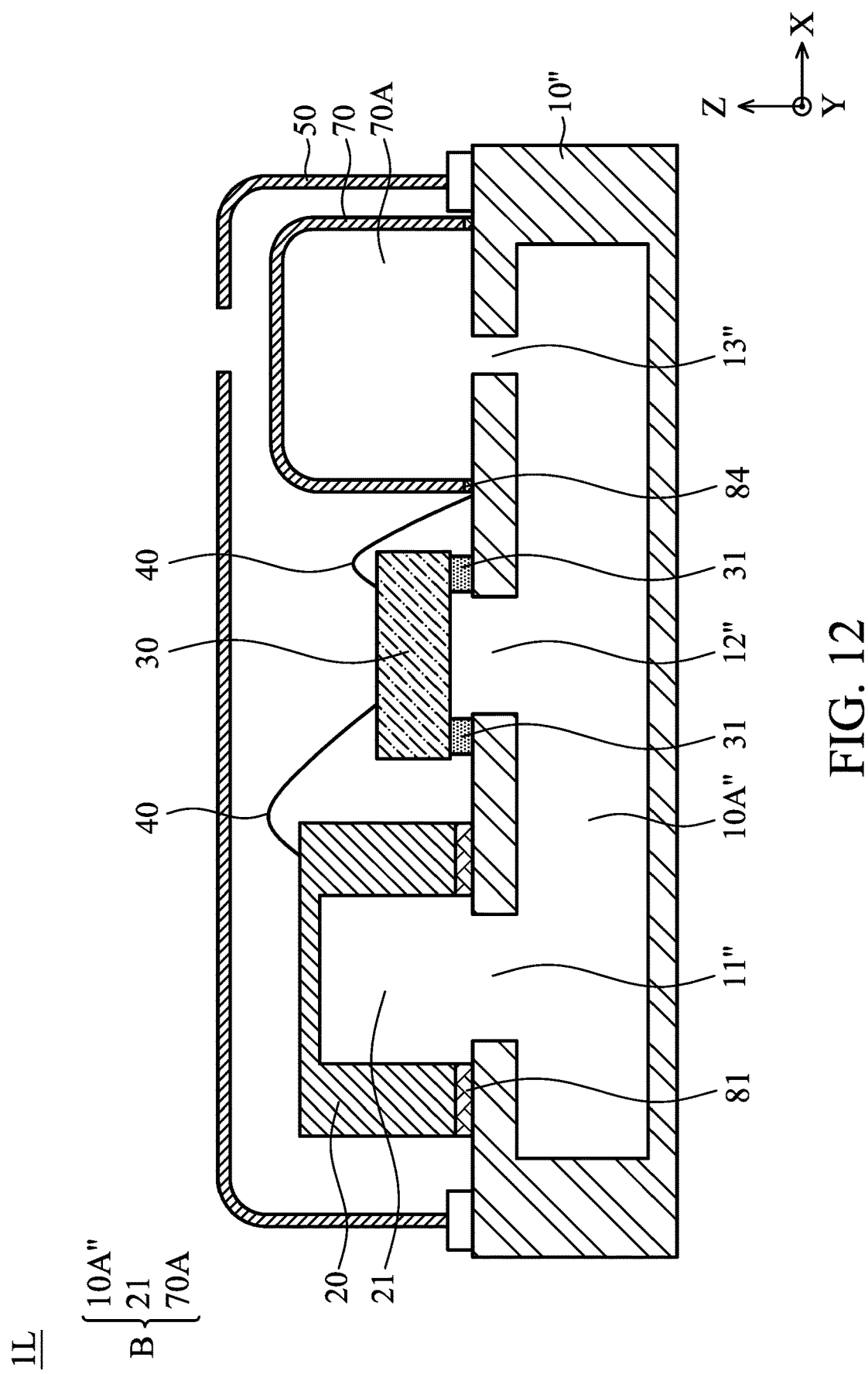
FIG. 12 is a schematic cross-sectional view illustrating the MEMS microphone package in accordance with some other embodiments of the present disclosure.

FIG. 12 is a schematic cross-sectional view illustrating the MEMS microphone package 1L in accordance with some other embodiments of the present disclosure. As shown in FIG. 12, the MEMS microphone package 1L includes a substrate 10", a transducer 20, an integrated circuit chip 30, a housing 50, and a lid 70. The substrate 10" has a first opening 11", a second opening 12", and a third opening 13", wherein the first cavity 21 of the transducer 20 communicates with the hollow chamber 10A" via the first opening 11", and an inner space 70A of the lid 70 communicates with the hollow chamber 10A" via the third opening 13". Accordingly, the back chamber B may include the hollow chamber 10A", the first cavity 21, and the inner space 70A.

Figure 13:
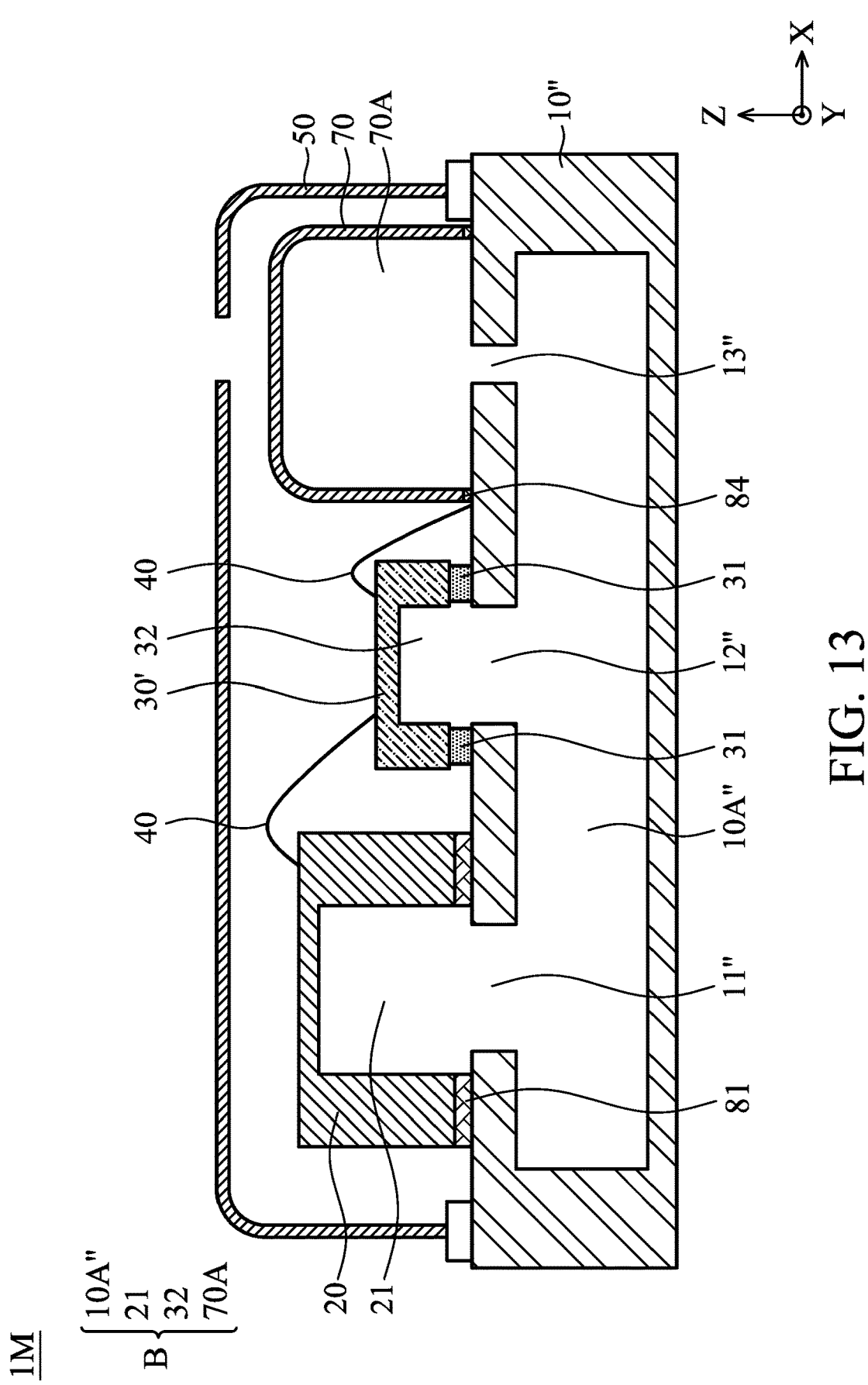
FIG. 13 is a schematic cross-sectional view illustrating the MEMS microphone package in accordance with some other embodiments of the present disclosure.

FIG. 13 is a schematic cross-sectional view illustrating the MEMS microphone package 1M in accordance with some other embodiments of the present disclosure. As shown in FIG. 13, the MEMS microphone package 1M includes a substrate 10", a transducer 20, an integrated circuit chip 30', a housing 50, and a lid 70. The substrate 10" has a first opening 11", a second opening 12", and a third opening 13". The first cavity 21 of the transducer 20 communicates with the hollow chamber 10A" via the first opening 11", The second cavity 32 of the integrated circuit chip 30' communicates with the hollow chamber 10A" via the second opening 12", and an inner space 70A of the lid 70 communicates with the hollow chamber 10A" via the third opening 13". Accordingly, the back chamber B may include the hollow chamber 10A", the first cavity 21, the second cavity 32, and the inner space 70A.

It should be noted that although the bonding layers 31, 81, 82, 83, and 84 discussed in foregoing paragraphs are labeled as different numerals, it is not intended to limit the present disclosure. Instead, those skilled in the art should understand that some or all of the bonding layers 31, 81, 82, 83, and 84 may be made of the same material. In addition, any suitable material may be used to bond those elements in the MEMS microphone package depending on the material properties of the elements.

As described above, some embodiments of the present disclosure provide a MEMS microphone package with a substrate, which has a hollow chamber and a plurality of openings that communicate with the hollow chamber. Accordingly, the volume of the back chamber of the MEMS microphone package may be increased. In addition, a hollow frame or lid may be disposed on the substrate, or a cavity may be formed in the integrated circuit chip in order to increase the volume of the back chamber of the MEMS microphone package. Therefore, the sensitivity of the MEMS microphone package may be enhanced.

While the embodiments and the advantages of the present disclosure have been described above, it should be understood that those skilled in the art may make various changes, substitutions, and alterations to the present disclosure without departing from the spirit and scope of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. As long as those may perform substantially the same function in the aforementioned embodiments and obtain substantially the same result, they may be used in accordance with some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. A MEMS microphone package, comprising:
   a substrate having a hollow chamber, a first opening and a second opening, wherein the first opening and the second opening communicate with the hollow chamber;
   a transducer disposed on the substrate;
   an integrated circuit chip, disposed on the substrate, adjacent to the transducer;
   a bonding layer disposed between the integrated circuit chip and the substrate, wherein a space is formed in the bonding layer, the space is located directly below the integrated circuit chip and communicates with the hollow chamber; and
   a housing, disposed on the substrate, covering the integrated circuit chip and the transducer, wherein the space directly below the integrated circuit chip does not communicate with a space between the housing and the integrated circuit chip.

2. The MEMS microphone package as claimed in claim 1, wherein the bonding layer is disposed around the first opening and the second opening.

3. The MEMS microphone package as claimed in claim 1, further comprising a plurality of wires disposed between the transducer and the integrated circuit chip, and between the integrated circuit chip and the substrate.

4. The MEMS microphone package as claimed in claim 1, further comprising a bonding layer disposed between the transducer and the substrate, wherein the transducer has a first cavity communicating with the hollow chamber via the first opening, and the bonding layer is disposed around the first opening.

5. The MEMS microphone package as claimed in claim 1, wherein the integrated circuit chip has a second cavity communicating with the hollow chamber via the second opening.

6. The MEMS microphone package as claimed in claim 1, further comprising a frame disposed on the substrate, and an opening of the frame overlaps either the first opening or the second opening.

7. The MEMS microphone package as claimed in claim 6, wherein the transducer and/or the integrated circuit chip is disposed on the frame.

8. The MEMS microphone package as claimed in claim 6, wherein the frame has a third cavity communicating with the hollow chamber via either the first opening or the second opening.

9. The MEMS microphone package as claimed in claim 1, further comprising at least one lid disposed on the substrate, wherein an inner space in the lid is a cavity and communicates with the hollow chamber.

10. A MEMS microphone package, comprising:
    a substrate having a hollow chamber;
    a transducer, disposed on the substrate, having a first cavity, wherein the first cavity communicates with the hollow chamber;
    an integrated circuit chip, disposed on the substrate, wherein the integrated circuit chip is recessed to form a second cavity, wherein the second cavity is surrounded by the integrated circuit chip and communicates with the hollow chamber; and
    a housing, disposed on the substrate, covering the integrated circuit chip and the transducer.

11. The MEMS microphone package as claimed in claim 10, further comprising a bonding layer disposed between the integrated circuit chip and the substrate, wherein the bonding layer is disposed around at least one opening of the substrate.

12. The MEMS microphone package as claimed in claim 10, further comprising a plurality of wires disposed between the transducer and the integrated circuit chip, and between the integrated circuit chip and the substrate.

13. The MEMS microphone package as claimed in claim 10, wherein the first cavity communicates with the hollow chamber via an opening of the substrate, and the second cavity communicates with the hollow chamber via another opening of the substrate.

14. The MEMS microphone package as claimed in claim 10, further comprising a frame disposed on the substrate, wherein an opening of the frame and an opening of the substrate overlap.

15. The MEMS microphone package as claimed in claim 14, wherein the transducer and/or the integrated circuit chip is disposed on the frame.

16. The MEMS microphone package as claimed in claim 14, wherein the frame has a third cavity communicating with the hollow chamber via the opening of the substrate.

17. The MEMS microphone package as claimed in claim 10, further comprising at least one lid disposed on the substrate, wherein an inner space in the lid is a cavity and communicates with the hollow chamber.

* * * * *